(12) United States Patent
Mokhtari et al.

(10) Patent No.: US 10,797,647 B1
(45) Date of Patent: Oct. 6, 2020

(54) RECEIVER APPARATUS

(71) Applicant: GM GLOBAL TECHNOLOGY OPERATIONS LLC, Detroit, MI (US)

(72) Inventors: Mehran Mokhtari, Tarzana, CA (US); Jongchan Kang, Moorpark, CA (US); Ara Kurdoghlian, La Canada, CA (US); Daniel Kuzmenko, Roseville, CA (US); Emilio A. Sovero, Thousand Oaks, CA (US); Robert G. Nagele, Thousand Oaks, CA (US); Hasan Sharifi, Agoura Hills, CA (US); Igal Bilik, Rehovot (IL)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/531,596

(22) Filed: Aug. 5, 2019

(51) Int. Cl.
  *H04B 1/28* (2006.01)
  *H03D 7/14* (2006.01)
  *H04B 1/10* (2006.01)

(52) U.S. Cl.
  CPC .......... *H03D 7/1441* (2013.01); *H04B 1/1027* (2013.01); *H04B 2001/1063* (2013.01)

(58) Field of Classification Search
  CPC .......... H04B 1/04; H04B 1/0475; H04B 1/16; H04B 1/40; H04B 1/109; H04B 1/1036; H04L 27/2647; H04L 67/12; H03B 5/1218; H03B 5/1228; H03B 5/1852; H03B 5/1876; H03F 3/72; H03F 3/193; H03F 2200/294
  See application file for complete search history.

(56) References Cited

U.S. PATENT DOCUMENTS

| | | | | |
|---|---|---|---|---|
| 7,529,529 B2 * | 5/2009 | Taylor | ................ | H03F 3/45179 455/130 |
| 7,890,076 B2 * | 2/2011 | Mattisson | ............ | H03D 7/1441 327/101 |
| 8,112,059 B2 * | 2/2012 | Beffa | ....................... | H03D 7/18 455/326 |
| 9,374,053 B2 * | 6/2016 | Jussila | ................ | H04B 1/0032 |
| 9,509,290 B2 * | 11/2016 | van Sinderen | ....... | H03K 3/0315 |
| 9,735,734 B2 * | 8/2017 | Mu | ...................... | H03D 7/1441 |
| 2006/0079053 A1 * | 4/2006 | Chen | ................. | H01L 21/28114 438/261 |

OTHER PUBLICATIONS

Microwave Mixers, 2nd edition by Stephen A. Mass, Artech House 1993, p. 320-322.
"Microwave Engineering 2nd Edition" by David M. Pozar, Wiley, p. 474-497.

* cited by examiner

*Primary Examiner* — Quochien B Vuong
(74) *Attorney, Agent, or Firm* — Cantor Colburn LLP

(57) ABSTRACT

A receiver apparatus is provided. The apparatus includes a single field effect transistor mixer comprising a gate, a source and a drain, wherein one of the source or the drain is configured to receive a first signal from a first low noise amplifier at a receiving frequency and another of the source or the drain is configured to output a second signal at an intermediate frequency to a second low noise amplifier; and a local oscillator configured to apply a third signal to the gate.

20 Claims, 3 Drawing Sheets

RECEIVER APPARATUS

INTRODUCTION

Apparatuses consistent with exemplary embodiments relate to receivers. More particularly, apparatuses consistent with exemplary embodiments relate to the architecture of receivers of a radar signal.

SUMMARY

One or more exemplary embodiments provide a receiving apparatus. More particularly, one or more exemplary embodiments provide a receiving apparatus with single field effect transistor mixer configured to convert a signal received at a receiving frequency to an intermediate frequency.

According to an aspect of an exemplary embodiment, a receiver apparatus is provided. The apparatus includes a transconductance mixer including a gate, a source and a drain, wherein the source is configured to receive a first signal from a first low noise amplifier at a receiving frequency and the drain is configured to output a second signal at an intermediate frequency to a second low noise amplifier; and a local oscillator configured to apply a third signal to the gate. The local oscillator may include a signal driver configured to drive a driver signal, a multiplier configured to receive the driver signal output by the signal driver, multiply the signal, and output a multiplied signal, a differential to single ended transformer configured to receive the multiplied signal, transform the multiplied signal, and output a transformed signal, a gain amplifier configured to receive the transformed signal, amplify the transformed signal, and output the gain amplified signal, and a filter including a notch filter and a bandpass filter, the filter configured to receive the gain amplified signal, filter the gain amplified signal to reject out-of-band harmonics and noise, and output a filtered signal as the third signal to the gate.

The signal driver may include a micrometer or millimeter wave source at a frequency of 'f.'

The multiplier may be a push-pull multiplier.

The transconductance mixer may be a single field effect transistor-based mixer.

The filter may include a parallel coupled transmission line filter or a quarter wave transformer.

The notch filter may an f*(n−m) filter, where 'f' is the frequency of signal driver, m is a frequency multiplier corresponding to the multiplier of the local oscillator, and n is frequency multiplier corresponding to the receiving frequency.

The bandpass filter may be an f*(m) filter, where 'f' is the frequency of signal driver and m is a frequency multiplier corresponding to the multiplier of the local oscillator.

The first low noise amplifier and the second low noise amplifier may be single ended low noise amplifiers.

The local oscillator may be configured to apply the third signal of 160 GHz to the gate.

The signal driver may be configured to drive the driver signal at 20 GHz.

The multiplier may be an 8× multiplier

The differential to single ended transformer may be a 160 GHz transformer

The gain amplifier may be a 160 GHz single ended power amplifier.

The notch filter may be an 80 GHz notch filter and the bandpass filter may include a quarter wave transformer.

The input stage of the apparatus, which is a part of the matching network, may include a shorted stub to protect downstream devices from electrostatic discharge.

The differential to single ended transformer may be implemented with an inverted micro-strip.

The apparatus may include signal lines implemented with micro-coax.

According to an aspect of another exemplary embodiment, a receiver apparatus is provided. The apparatus includes a single field effect transistor mixer including a gate, a source and a drain, wherein one of the source or the drain is configured to receive a first signal from a first low noise amplifier at a receiving frequency and another of the source or the drain is configured to output a second signal at an intermediate frequency to a second low noise amplifier; and a local oscillator configured to apply a third signal to the gate.

The first low noise amplifier and the second low noise amplifier may be single ended low noise amplifiers.

The receiving frequency of the first signal may be 'f'*n, the intermediate frequency of the second signal may be 'f'*(n−m), and the frequency of third signal may be f'*(m), where f is the frequency, 'n' and 'm' are constant values.

Other objects, advantages and novel features of the exemplary embodiments will become more apparent from the following detailed description of exemplary embodiments and the accompanying drawings.

DETAILED DESCRIPTION

Figure 1:
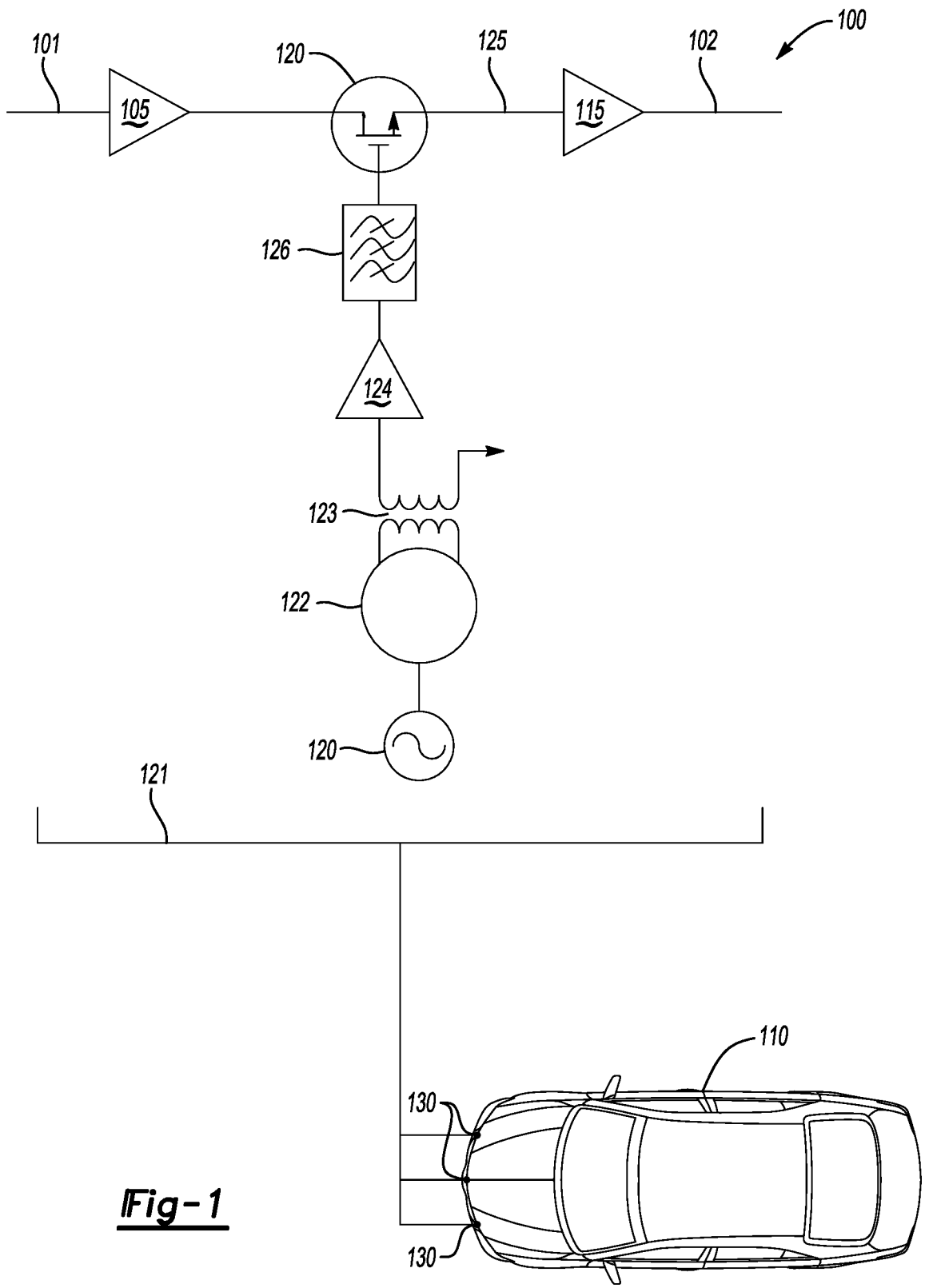
FIG. 1 shows a schematic of the architecture of the receiving apparatus according to an exemplary embodiment.

A receiving apparatus will now be described in detail with reference to FIGS. 1-3 of the accompanying drawings in which like reference numerals refer to like elements throughout.

The following disclosure will enable one skilled in the art to practice the inventive concept. However, the exemplary embodiments disclosed herein are merely exemplary and do not limit the inventive concept to exemplary embodiments described herein. Moreover, descriptions of features or aspects of each exemplary embodiment should typically be considered as available for aspects of other exemplary embodiments.

It is also understood that where it is stated herein that a first element is "connected to," "attached to," "formed on," or "disposed on" a second element, the first element may be connected directly to, formed directly on or disposed directly on the second element or there may be intervening elements between the first element and the second element, unless it is stated that a first element is "directly" connected to, attached to, formed on, or disposed on the second element. In addition, if a first element is configured to "send" or "receive" information from a second element, the first element may send or receive the information directly to or from the second element, send or receive the information via a bus, send or receive the information via a network, or send or receive the information via intermediate elements, unless the first element is indicated to send or receive information "directly" to or from the second element.

Throughout the disclosure, one or more of the elements disclosed may be combined into a single device or combined into one or more devices. In addition, individual elements may be provided on separate devices.

Vehicles such as passenger cars, motorcycles, trucks, sports utility vehicles (SUVs), recreational vehicles (RVs), marine vessels, aircraft, etc., are being equipped with radar devices configured to detect objects around the vehicle. The detection and tracking of objects may be used in autonomous vehicle system applications as well as advanced safety systems.

Radars may function at many different frequencies. For example, high-resolution imaging in radars can be achieved by increasing radar operation frequency. One type of radar used in automotive applications is a 77 GHz radar, that may include a system-on-chip. This system on chip radar may be leveraged to implement a higher frequency radar by up converting and amplifying the radar frequency. However, there may be issues in that the increase of operation frequency may degrade transmission power, most receivers are based on differential and balanced mixer architecture, and there may be leakage of the sub-harmonic of a local oscillator (LO) into the intermediate frequency (IF). A receiving apparatus with coherent local LO based receiver architecture design to leverage the system on chip radar by upconverting the 77 GHz radar signal, according to exemplary embodiment, addresses the aforementioned issues.

FIG. 1 shows a schematic of the architecture of the receiving apparatus 100 according to an exemplary embodiment. As shown in FIG. 1, one or more of the receiver apparatus 100 may be on a vehicle 110 and connected to a plurality of antennas 130. The receiver apparatus 100 may include a transconductance mixer 125. The transconductance mixer 125 may include a source or drain configured to receive a first signal 101 at a reception or receiving frequency (RF) 101 and a drain or source configured to output a second signal 102 at an intermediate frequency. A single ended low noise amplifier 105 may be configured to receive the first signal 101 at a reception or receiving frequency 101 and output the signal to the source or drain. Another single ended low noise amplifier 115 may be configured to receive the second signal 102 at the intermediate frequency from the drain or source and output the second signal 102 to the system on chip radar.

The gate of the transconductance mixer 125 may be connected to a local oscillator (LO) 120 that applies a signal to the gate. The LO may include one or more from among a source signal driver 121, a multiplier 122, a transformer 123, an amplifier 124 and a filter 126. In one example, the LO may be configured to apply a 160 GHz or 154 GHz signal to the gate.

The signal driver 121 may be configured to drive a driver signal. The signal driver may be a micrometer or millimeter wave source. In one example, the signal driver 121 may be configured to drive the driver signal at 20 GHz or a 19.25 GHz signal.

The multiplier 122 may be configured to receive the driver signal output by the signal driver 121, multiply the driver signal, and output a multiplied signal. The multiplier may be a push-pull multiplier and, in one example, the multiplier may be an 8× multiplier.

The transformer 123 may be a differential to single ended transformer configured to receive the multiplied signal, transform the multiplied signal, and output a transformed signal. In one example, the differential to single ended transformer may be a 160 GHz or 154 GHz transformer. In another example, the differential to single ended transformer may be implemented with an inverted micro-strip.

The amplifier 124 may be a gain amplifier configured to receive the transformed signal, amplify the transformed signal, and output the gain amplified signal. The transconductance mixer 125 may be a single field effect transistor-based mixer or a microwave mixer.

The filter 126 may include a notch filter and a bandpass filter. The filter 126 may be configured to receive the gain amplified signal, filter the gain amplified signal, and output a filtered signal as the third signal to the gate. The bandpass filter may filter to output an f*(m) signal, where 'f' is the frequency of signal driver and m is a frequency multiplier corresponding to the multiplier of the local oscillator. The notch filter may filter to output an f*(n−m) signal, where 'f' is the frequency of signal driver, m is a frequency multiplier corresponding to the multiplier of the local oscillator, and n is frequency multiplier corresponding to the receiving frequency. In one example, the notch filter may be an 80 GHz notch filter and the bandpass filter may include a quarter wave transformer or a transmission line filter. The filter may be configured to filter the gain amplified signal to reject out-of-band harmonics and noise.

Figure 2A:
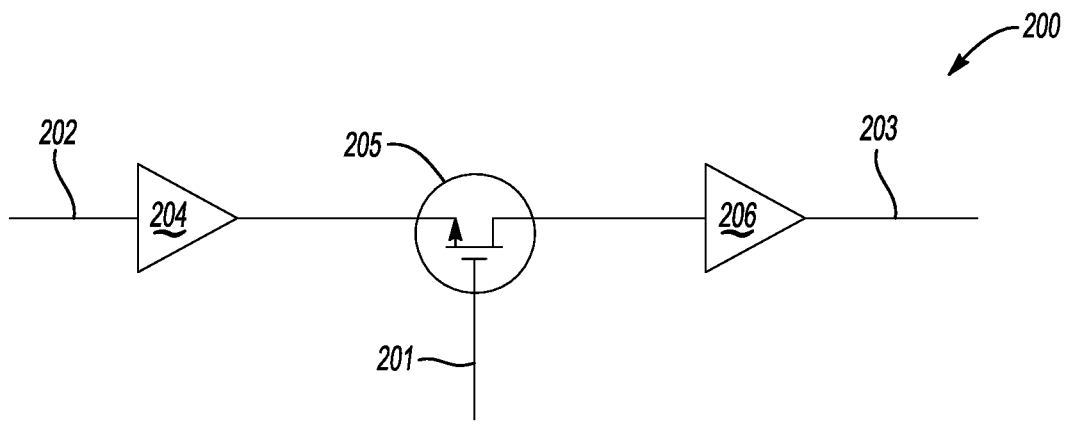
FIGS. 2A-2B show radio frequency properties of the receiving apparatus according to aspects of an exemplary embodiment.
Figure 2B:
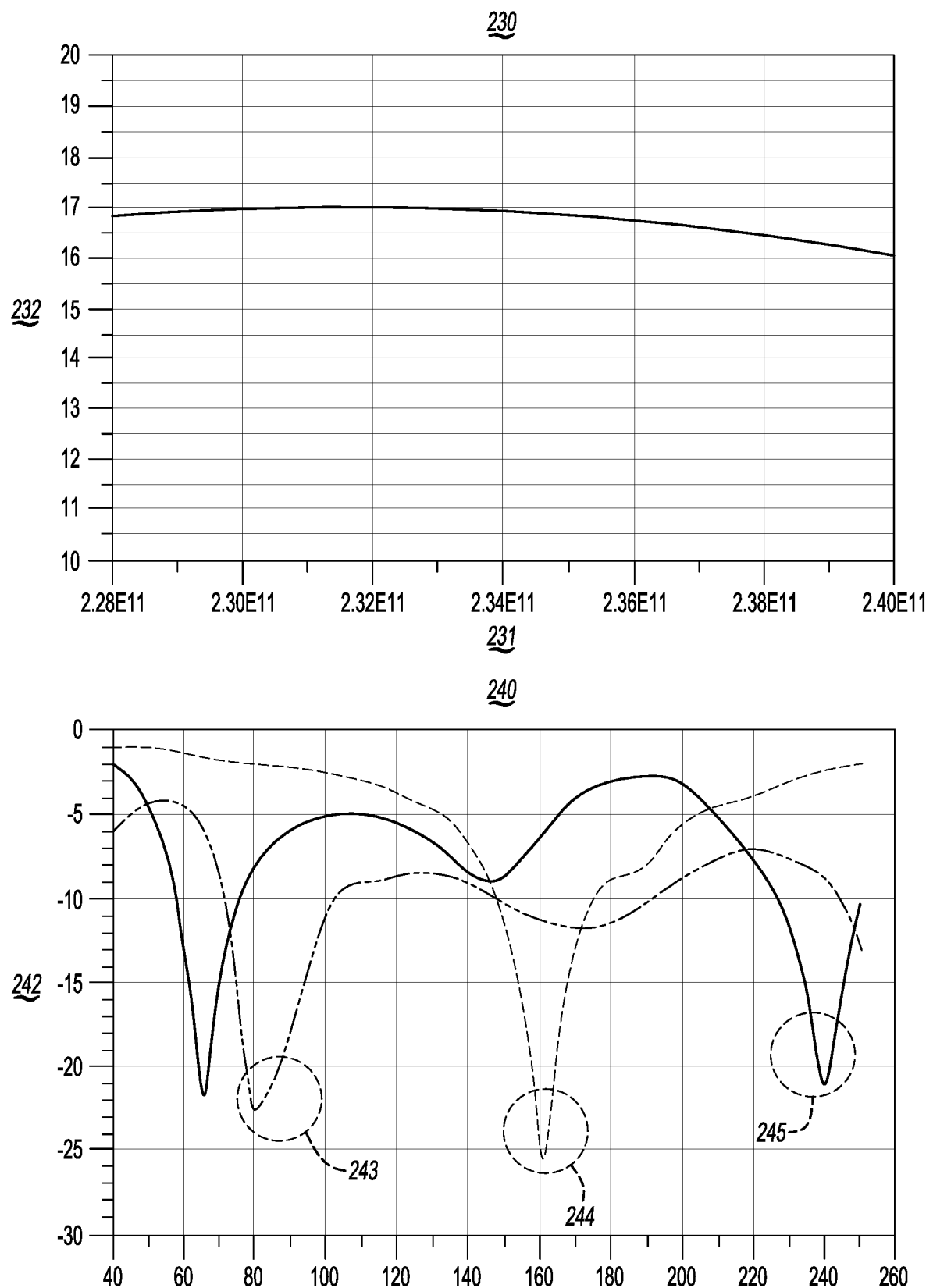

FIGS. 2A-2B show radio frequency properties of the receiving apparatus according to aspects of an exemplary embodiment.

Referring to FIG. 2A, a receiver apparatus 200 is shown. The receiver apparatus may include a transconductance mixer 205. The transconductance mixer 205 may include a source configured to receive a first signal 202 at a reception or receiving frequency 101 through a single ended low noise amplifier 202. The transconductance mixer 205 may also include a drain configured to output a second signal 203 at an intermediate frequency to another single ended low noise amplifier 206. The gate of the transconductance mixer 205 may be connected to a local oscillator (LO) 201 that applies a signal to the gate.

The radio frequency properties of the receiver apparatus 200 are shown in table 210. For example, a conversation gain 211 may be in the range 221 of 16-17 dB. The NF 212 may be 12 dB. The Γ_RF 213 may be less than −15 dB, the Γ_IF 214 may be less than −18 dB, the Γ_LO 215 may be less than −19 dB, and power of the LO 216 may be around 3 dBm.

Referring to FIG. 2B, a first graph 230 shows the conversion gain 232 of the receiving frequency 231. A second graph 240 shows the reflection coefficient 242 at specific frequencies 241 of the IF signal 243, the RF signal 245, and the LO signal 244.

Figure 3:
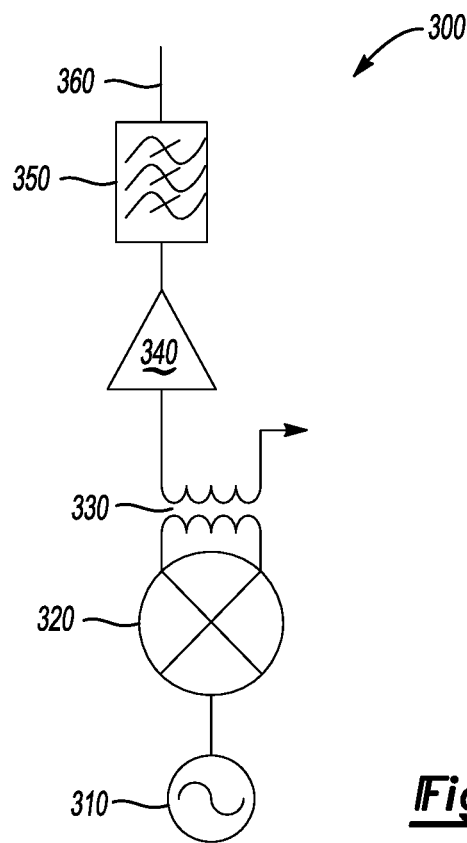
FIG. 3 shows a schematic of the architecture of a 160 GHz local oscillator of the receiving apparatus according to an aspect of an exemplary embodiment.

FIG. 3 shows a schematic of the architecture of a 160 GHz local oscillator of the receiving apparatus according to an aspect of an exemplary embodiment.

Referring to FIG. 3, the 160 GHz local oscillator 300 may include a signal driver 310 that may be configured to drive the driver signal at 20 GHz and output the driver signal to a multiplier 320. The multiplier 320 may be an 8× push-pull multiplier and be configured to output a signal to a 160 GHz differential to single ended transformer 330. The transformer 330 may be configured to output a transformed signal to a 160 GHz LO power gain amplifier 340, which amplifies and outputs the gain amplified signal to filter 350. The filter 350 may be an 80 GHz notch filter with quarter wave transformer configured to filter the signal and output the LO signal to the mixer gate.

The processes, methods, or algorithms disclosed herein can be deliverable to/implemented by a processing device, controller, or computer, which can include any existing programmable electronic control device or dedicated electronic control device. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

One or more exemplary embodiments have been described above with reference to the drawings. The exemplary embodiments described above should be considered in a descriptive sense only and not for purposes of limitation. Moreover, the exemplary embodiments may be modified without departing from the spirit and scope of the inventive concept, which is defined by the following claims.

What is claimed is:

1. A receiver apparatus, the apparatus comprising:
   a transconductance mixer comprising a gate, a source and a drain, wherein the source is configured to receive a first signal from a first low noise amplifier at a receiving frequency and the drain is configured to output a second signal at an intermediate frequency to a second low noise amplifier; and
   a local oscillator configured to apply a third signal to the gate, wherein the local oscillator comprises:
   a signal driver configured to drive a driver signal;
   a multiplier configured to receive the driver signal output by the signal driver, multiply the signal, and output a multiplied signal;
   a differential to single ended transformer configured to receive the multiplied signal, transform the multiplied signal, and output a transformed signal;
   a gain amplifier configured to receive the transformed signal, amplify the transformed signal, and output the gain amplified signal; and
   a filter comprising a notch filter and a bandpass filter, the filter configured to receive the gain amplified signal, filter the gain amplified signal to reject out-of-band harmonics and noise, and output a filtered signal as the third signal to the gate.

2. The apparatus of claim 1, wherein the signal driver comprises a micrometer or millimeter wave source at a frequency of 'f.'.

3. The apparatus of claim 1, wherein the multiplier comprises a push-pull multiplier.

4. The apparatus of claim 1, wherein the transconductance mixer comprises a single field effect transistor-based mixer.

5. The apparatus of claim 1, wherein the filter comprises a parallel coupled transmission line filter or a quarter wave transformer.

6. The apparatus of claim 1, wherein the notch filter comprises an f*(n−m) filter,
   where 'f' is the frequency of signal driver, m is a frequency multiplier corresponding to the multiplier of the local oscillator, and n is frequency multiplier corresponding to the receiving frequency.

7. The apparatus of claim 1, wherein the bandpass filter comprises an f*(m) filter,
   where 'f' is the frequency of signal driver and m is a frequency multiplier corresponding to the multiplier of the local oscillator.

8. The apparatus of claim 1, wherein the first low noise amplifier and the second low noise amplifier comprise single ended low noise amplifiers.

9. The apparatus of claim 1, wherein the local oscillator is configured to apply the third signal of 160 GHz to the gate.

10. The apparatus of claim 9, wherein the signal driver is configured to drive the driver signal at 20 GHz.

11. The apparatus of claim 10, wherein the multiplier is an 8× multiplier.

12. The apparatus of claim 11, wherein the differential to single ended transformer is a 160 GHz transformer.

13. The apparatus of claim 12, wherein the gain amplifier is a 160 GHz single ended power amplifier.

14. The apparatus of claim 1, wherein the notch filter is an 80 GHz notch filter and the bandpass filter comprises a quarter wave transformer.

15. The apparatus of claim 1, wherein an input stage, which is a part of the matching network, comprises a shorted stub to protect downstream devices from electrostatic discharge.

16. The apparatus of claim 1, wherein the differential to single ended transformer is implemented with an inverted micro-strip.

17. The apparatus of claim 1, further comprising signal lines implemented with micro-coax.

18. The apparatus of claim 17, wherein the receiving frequency of the first signal is 'f'*n, the intermediate frequency of the second signal is 'f'*(n−m), and the frequency of third signal is f'*(m), where f is the frequency, 'n' and 'm' are constant values.

19. A receiver apparatus, the apparatus comprising:
    a single field effect transistor mixer comprising a gate, a source and a drain, wherein one of the source or the drain is configured to receive a first signal from a first low noise amplifier at a receiving frequency and another of the source or the drain is configured to output a second signal at an intermediate frequency to a second low noise amplifier; and
    a local oscillator configured to apply a third signal to the gate, wherein the local oscillator comprises:
    a signal driver configured to drive a driver signal;
    a multiplier configured to receive the driver signal output by the signal driver, multiply the signal, and output a multiplied signal;
    a differential to single ended transformer configured to receive the multiplied signal, transform the multiplied signal, and output a transformed signal;
    a gain amplifier configured to receive the transformed signal, amplify the transformed signal, and output the gain amplified signal; and
    a filter comprising a notch filter and a bandpass filter, the filter configured to receive the gain amplified signal, filter the gain amplified signal to reject out-of-band harmonics and noise, and output a filtered signal as the third signal to the gate.

20. The apparatus of claim 19, wherein the first low noise amplifier and the second low noise amplifier comprise single ended low noise amplifiers.

* * * * *